(12) United States Patent
Hyun et al.

(10) Patent No.: US 7,397,321 B2
(45) Date of Patent: Jul. 8, 2008

(54) DIGITALLY CONTROLLED CIRCULATOR AND RADIO FREQUENCY IDENTIFICATION READER HAVING THE SAME

(75) Inventors: Seok Bong Hyun, Daejeon (KR); Kyung Hwan Park, Daejeon (KR); Tae Young Kang, Seoul (KR); Seong Su Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 210 days.

(21) Appl. No.: 11/499,440

(22) Filed: Aug. 4, 2006

(65) Prior Publication Data

US 2007/0096842 A1 May 3, 2007

(30) Foreign Application Priority Data

Nov. 3, 2005 (KR) .................. 10-2005-0104852

(51) Int. Cl.
*H01P 1/38* (2006.01)
(52) U.S. Cl. ..................... 333/1.1; 333/24 R
(58) Field of Classification Search .............. 333/1.1, 333/24.2, 2, 24 R, 172
See application file for complete search history.

(56) References Cited

U.S. PATENT DOCUMENTS

| 3,676,803 A | * | 7/1972 | Simmons ................. 333/1.1 |
| 5,144,266 A | | 9/1992 | Dougherty et al. |
| 6,838,989 B1 | | 1/2005 | Mays et al. |
| 2005/0156039 A1 | | 7/2005 | Carrender et al. |

OTHER PUBLICATIONS

"Power and Noise Limitations of Active Circulators" by Geert Carchon et al.; *IEEE Transactions on Microwave Theory and Techniques*, vol. 48, No. 2, Feb. 2000; pp. 316-319.

* cited by examiner

*Primary Examiner*—Stephen E Jones
(74) *Attorney, Agent, or Firm*—Blakely, Sokoloff, Taylor & Zafman

(57) ABSTRACT

Provided are a digitally controlled circulator and a radio frequency identification (RFID) reader having the circulator. A power splitter is composed of lumped elements and the values of the elements are digitally changed using switching means, in which the transmission loss of a signal is controlled according to whether the reader is in a transmission state or a reception state. Therefore, the loss can be minimized, and the circulator can be miniaturized and priced down by an integrated circuit (IC) semiconductor process and mounted in a mobile terminal such as a cellular phone.

11 Claims, 7 Drawing Sheets

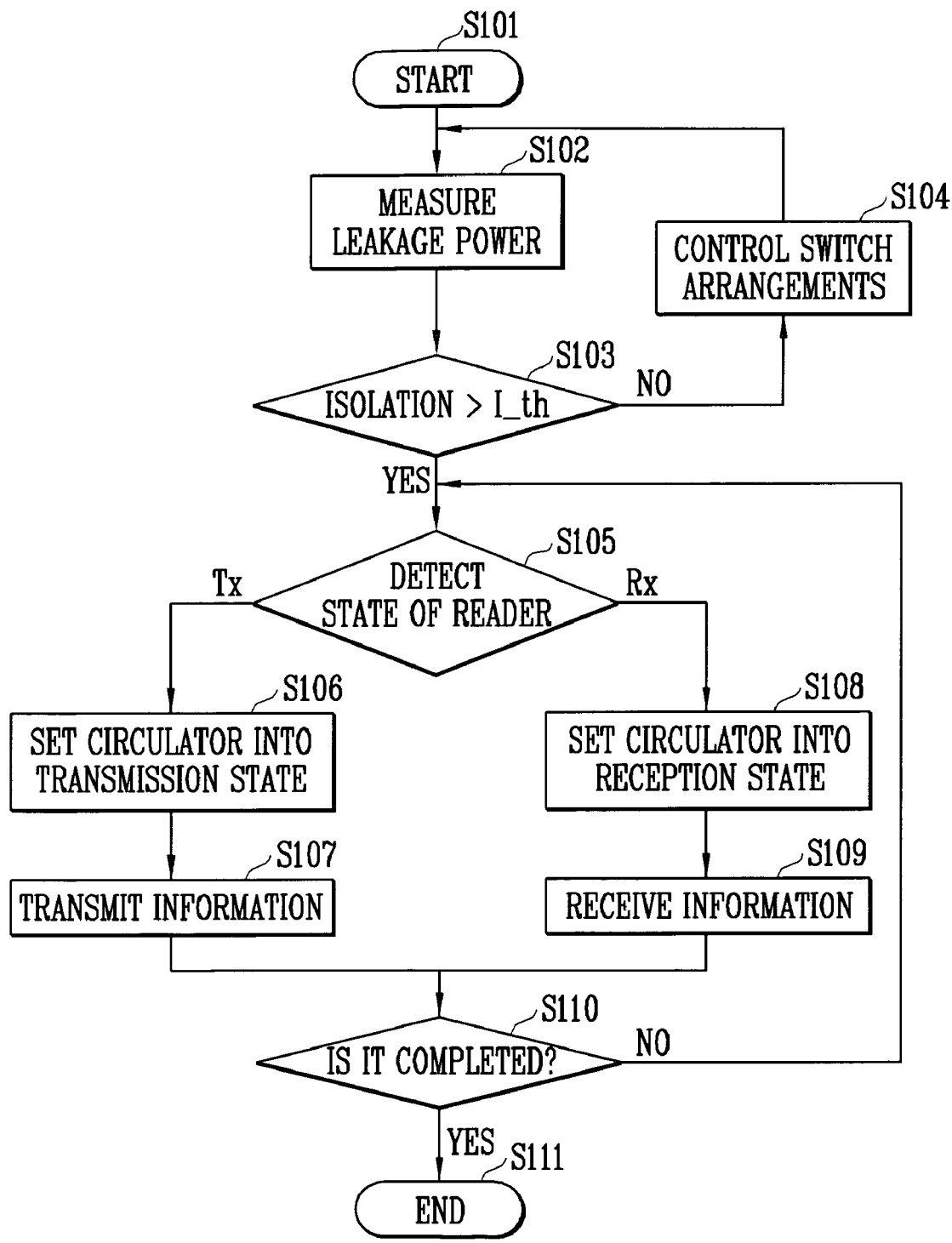

DIGITALLY CONTROLLED CIRCULATOR AND RADIO FREQUENCY IDENTIFICATION READER HAVING THE SAME

CROSS-REFERENCE TO RELATED APPLICATION

This application claims priority to and the benefit of Korean Patent Application No. 2005-104852, filed Nov. 3, 2005, the disclosure of which is incorporated herein by reference in its entirety.

BACKGROUND

1. Field of the Invention

The present invention relates to a circulator that is applied to a radio frequency (RF) transceiver system and a radio frequency identification (RFID) reader having the circulator, and more particularly, to a digitally controlled circulator that can be mounted in a small portable terminal such as a cellular phone and an RFID reader having the circulator.

2. Discussion of Related Art

RFID is a technology that reads information from a tag or writes information to a tag using an RF and is used to identify, trace and manage goods, animals, people and so forth to which a tag is attached. An RFID system based on the RFID technology comprises a tag or a transponder that has unique identification information and is attached to goods, people or so forth; a reader that reads the identification information from the tag or writes information to the tag; an object database; a network; and so forth.

Lately, an ultra high frequency (UHF) band RFID system is used to manage the distribution of goods. In addition, since an electronic product code (EPC) global generation-2 standard (refer to EPC Gen-2 standardization documents) and an international standardization organization (ISO) international standard are established as the standards of an air-interface for RFID, the UHF-band RFID system is expected to be extensively used, the EPC global generation-2 standard and ISO international standard aiming at assigning consistent unique codes to all goods mainly through an Auto-ID center.

FIGS. 1a and 1b are block diagrams illustrating a RFID reader used in conventional RFID system.

Referring to FIG. 1a, a signal carrying tag information is sent from a processor 100, which includes a microprocessor 101 and a memory 102, to a modem 104 through a bus line 103. The RF signal is sent to a transmitter 105 through the modem 104 and sent to a tag through an antenna 110. In addition, tag information that is received through the antenna 110 is sent to a receiver 106, and is sent to the processor 100 through the bus line 103 by the modem 104.

When the RF signal is sent from the transmitter 105 to the tag, a circulator 120 segregates the receiver 106 from the transmitter 105 to protect the receiver 106, the circulator 120 being disposed among the transmitter 105, the receiver 106, and the antenna 110.

Referring to FIG. 1b, the RFID reader has a structure in which an antenna 140 for sending an RF signal is separated from another antenna 141 for receiving an RF signal. A signal carrying tag information is sent from a processor 130 to a modem 134 through a bus line 133, the processor 130 consisting of a microprocessor 131 and a memory 132. The RF signal is sent to a transmitter 135 through the modem 134 and sent to a tag through the antenna 140. In addition, the tag information that is received through the antenna 141 is sent to a receiver 136, and is sent to the processor 130 through the bus line 103 by the modem 134.

The ferrite circulator 120 that operates as described above has excellent electrical performance. However, since the circulator 120 is made up of a great-sized magnetic material which cannot be fabricated by a general integrated circuit (IC) semiconductor process, it is not suitable for small, highly integrated, and inexpensive readers.

In addition, when the structure having the two antennas 140 and 141 as described above is applied to the system using a UHF band, dimensions occupied by the antennas increase, so that it is difficult to apply the structure to small devices such as cellular phones.

Therefore, in order to solve the problems, provided are an active circulator comprising transistors and a passive circulator based on a Wilkinson power splitter.

FIG. 2a shows an example of a conventional active circulator comprising transistors. In the active circulator, an antenna is connected to a first terminal P1 of a power splitter, and a signal that reflects from a tag and is received through the antenna is equally distributed to a second terminal P2 connected with a transmitter and a third terminal P3 connected with a receiver. Here, matching networks 210 and 220 are respectively connected with the second terminal P2 and the third terminal P3, and transistors T1 and T2 are respectively connected between the matching network 210 and the first terminal P1 and between the matching network 220 and the first terminal P1. The drain of the transistor T1 is connected with the first terminal P1 through a microstrip transmission line 201, the source of the transistor T1 is connected with the gate of the transistor T2 through a microstrip transmission line 202, and the gate of the transistor T2 is connected to a ground terminal through a microstrip transmission line 203.

FIG. 2b shows an example of a conventional passive circulator based on a Wilkinson power splitter. The passive circulator is a quasi-circulator including microstrip transmission lines on the basis of the principle of the Wilkinson power splitter.

An antenna is connected to a first terminal P1 of a power splitter, and a signal that reflects from a tag and is received through the antenna is equally distributed to a second terminal P2 connected to a transmitter and a third terminal P3 connected to a receiver and thus is transmitted. Here, a microstrip transmission line 230 is connected between the first terminal P1 and the second terminal P2, and a microstrip transmission line 231 is connected between the first terminal P1 and the third terminal P3.

The circulator that comprises only electronic devices as described above is easily integrated into a monolithic microwave integrated circuit (MMIC) or a radio frequency integrated circuit (RFIC). However, in the circulator comprising the transistors, the sensitivity of the receiver deteriorates due to noise generated at the transistors T1 and T2, and the transmitter barely processes a high output signal of more than 20 dBm without distortion due to a nonlinearity characteristic. Generally, when an active circulator is used, power can be transmitted without loss. However, it is known that the active circulator has worse characteristics than a passive circulator due to a very high noise figure (NF) (See "IEEE Trans. Microwave Theory and Tech.," G. Carchon and B. Nauwelaers, Vol. 48, No. 2, pp. 316-319, 2000).

Meanwhile, in the passive circulator based on the Wilkinson power splitter, electrical characteristics can be fixed by equivalent inductance and capacitance. The equal distribution of the signal received through the antenna to the transmitter and the receiver, however, causes an insertion loss of 3 dB. This insertion loss increases the NF, deteriorating receive sensitivity, and increases a bit error rate (BER). Therefore, the passive circulator based on the Wilkinson power splitter is difficult to apply to an RFID system requiring a very low BER.

SUMMARY OF THE INVENTION

It is an object of the present invention to provide a circulator and a radio frequency identification (RFID) reader having the circulator, the circulator having less loss in transmitting and receiving a radio frequency (RF) signal and being digitally controlled.

It is another object of the present invention to provide a circulator and an RFID reader having the circulator, the circulator being capable of being miniaturized and priced down by an integrated circuit (IC) semiconductor process and being digitally controlled.

One aspect of the present invention provides a digitally controlled circulator comprising first and second variable inductors connected between a first terminal and a second terminal in series; third and fourth variable inductors connected between the first terminal and a third terminal in series; a variable resistor connected between a first node and a second node, the first node being a junction of the first and second variable inductors and the second node being a junction of the third and fourth variable inductors; first, second and third variable capacitors respectively connected between the first terminal and a ground terminal, between the first node and a ground terminal, and between the second node and a ground terminal; a logic controller that provides respective control values for changing the values of the first to fourth variable inductors, the variable resistor, and the first to third variable capacitors; and a memory storing the control values.

Another aspect of the present invention provides an RFID reader having the circulator, the RFID reader comprising an antenna connected to the first terminal of the circulator; a transmitter connected to the second terminal of the circulator for sending a signal carrying tag information through the antenna; a receiver connected to the third terminal of the circulator for receiving tag information through the antenna; and a processor connected with the logic controller of the circulator for generating the signal carrying tag information and processing the received tag information.

The first to fourth variable inductors may include a plurality of inductors connected to an input end in series, and a plurality of switching means that are connected between the inductors and an output end in parallel and separately operates according to the control values provided from the logic controller.

The variable resistor may include a plurality of resistors connected between an input end and an output end in series, and a plurality of switching means that are connected between the resistors and the output end in parallel and separately operate according to the control values provided from the logic controller.

The first to third variable capacitors may include a plurality of capacitors connected to an input end in parallel, and a plurality of switching means that are connected between the capacitors and a ground terminal in series and separately operate according to the control values provided from the logic controller.

The values of the first to fourth variable inductors, the variable resistor, and the first to third variable capacitors may be set so that a transmission loss from the second terminal P2 to the first terminal P1 is less than that from the first terminal P1 to the third terminal P3 when the reader is in a transmission state and a transmission loss from the first terminal P1 to the third terminal P3 is less than that from the first terminal P1 to the second terminal P2 when the reader is in a reception state.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIG. 8 is a flowchart showing the operation of the RFID reader having the circulator according to an exemplary embodiment of the present invention.

DETAILED DESCRIPTION OF PREFERRED EMBODIMENTS

Hereinafter, an exemplary embodiment of the present invention will be described in detail. However, the present invention is not limited to the embodiments disclosed below, but can be implemented in various types. Therefore, the present embodiment is provided for complete disclosure of the present invention and to fully inform the scope of the present invention to those ordinarily skilled in the art.

Figure 1A:
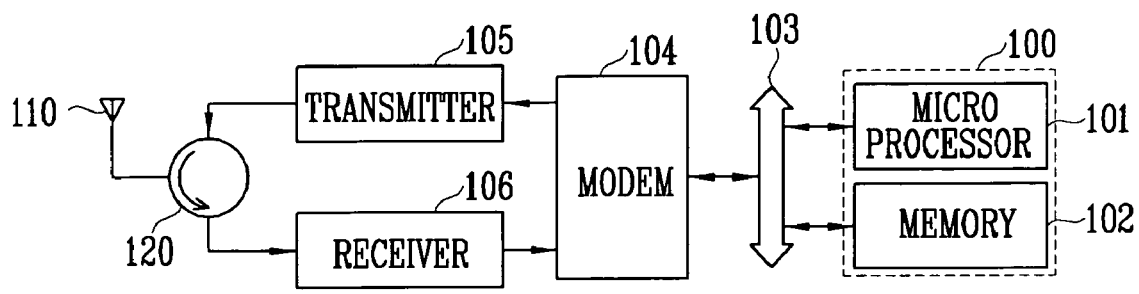
FIGS. 1a and 1b are block diagrams illustrating a conventional radio frequency identification (RFID) reader.
Figure 1B:
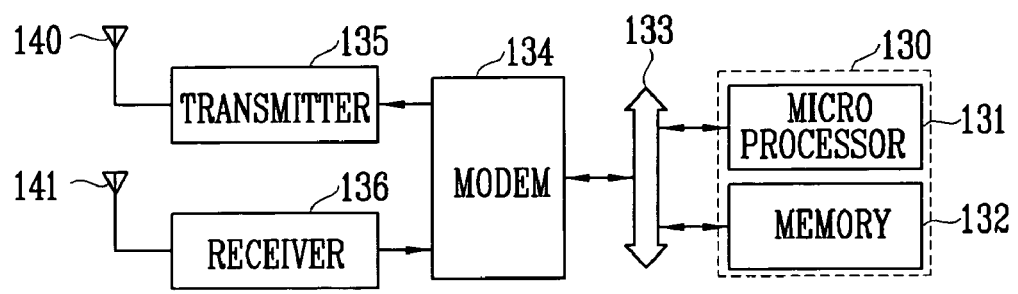
Figure 2A:
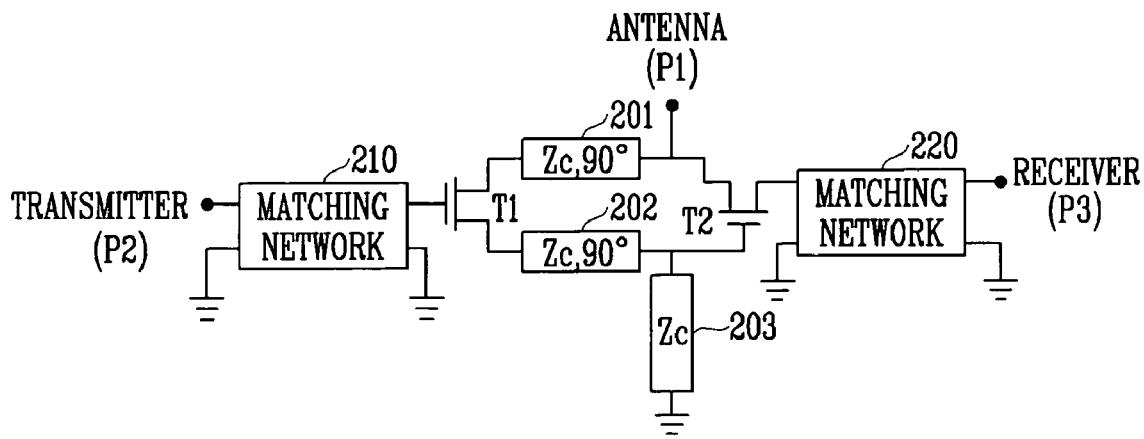
FIGS. 2a and 2b are circuit diagrams illustrating a conventional circulator.
Figure 2B:
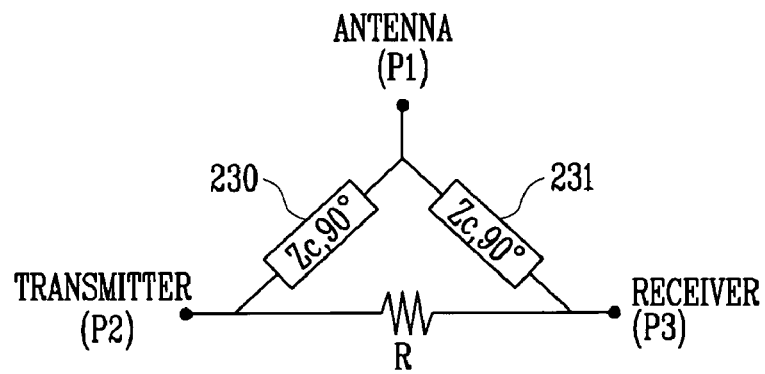
Figure 3:
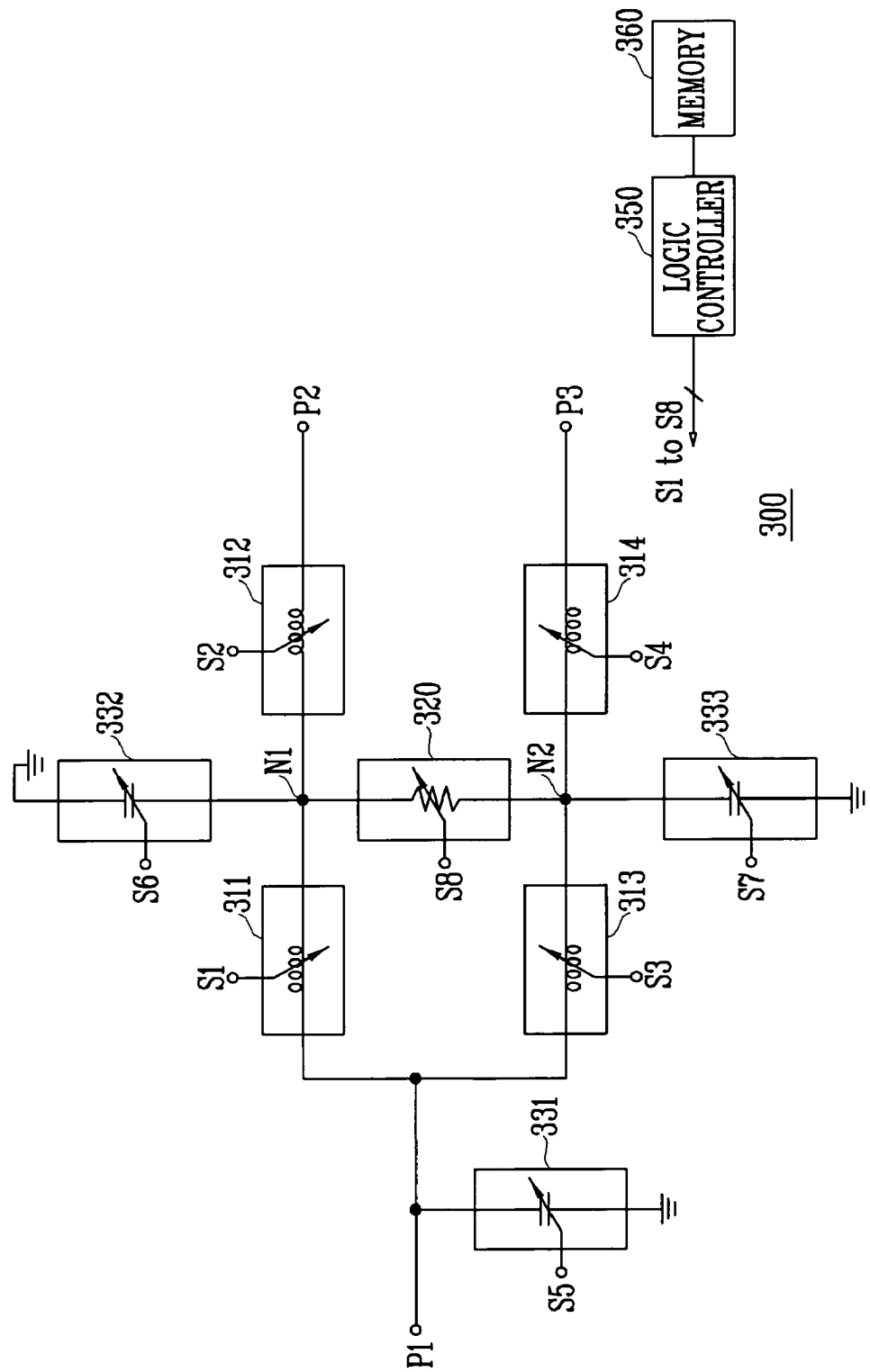
FIG. 3 is a circuit diagram illustrating a digitally controlled circulator according to an exemplary embodiment of the present invention.

FIG. 3 is a circuit diagram illustrating a digitally controlled circulator according to an exemplary embodiment of the present invention.

The circulator 300 includes a first terminal P1 connected to an antenna, a second terminal P2 connected to a transmitter, and a third terminal P3 connected to a receiver. Between the first terminal and the second terminal, first and second variable inductors 311 and 312 are connected in series. And between the first terminal P1 and the third terminal P3, third and fourth variable inductors 313 and 314 are connected in series. A variable resistor 320 is connected between a first node N1 and a second node N2, the first node N1 being a junction of the first and second variable inductors 311 and 312 and the second node N2 being a junction of the third and fourth variable inductors 313 and 314. First, second and third variable capacitors 331, 332 and 333 are respectively connected between the first terminal P1 and a ground terminal, between the first node N1 and a ground terminal, and between the second node N2 and a ground terminal.

The values of the first to fourth variable inductors 311 to 314, the variable resistor 320, and the first to third variable capacitors 331 to 333 are respectively changed by switch control values S1 to S8 that are provided from a logic controller 350. The switch control values are previously prepared and stored in a memory 360. For example, the performance of the circulator is measured at each frequency band, and optimal switch control values suitable for several operating states are calculated and stored in the memory 360.

Figure 4A:
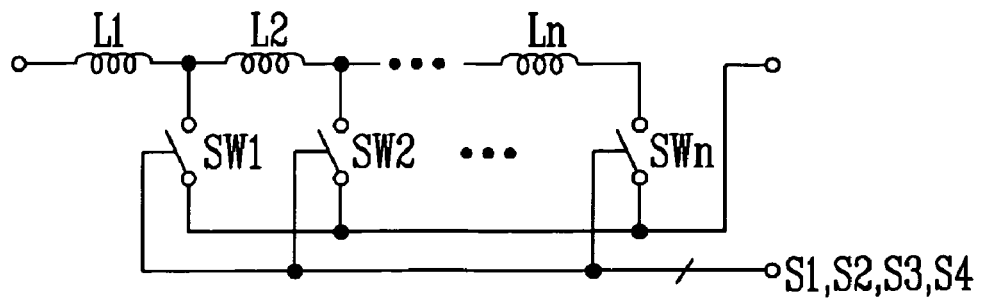
FIG. 4a is a circuit diagram illustrating a variable inductor shown in FIG. 3.

As illustrated in FIG. 4a, the first to fourth variable inductors 311 to 314 include a plurality of inductors L1 to Ln connected to an input end in series, and a plurality of switching means SW1 to SWn that are connected between the inductors L1 to Ln and an output end in parallel and separately operate according to the switch control values S1 to S4 that are provided from the logic controller 350.

Figure 4B:
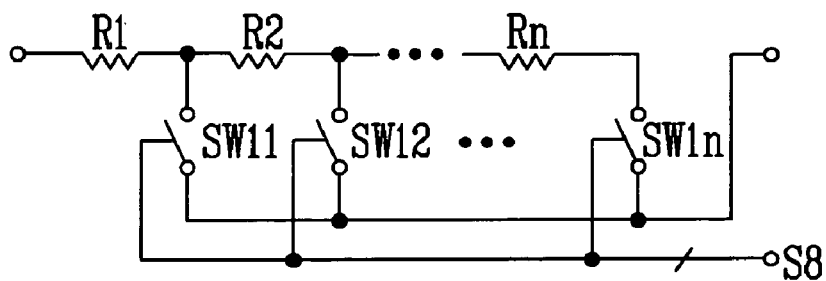
FIG. 4b is a circuit diagram illustrating a variable resistor shown in FIG. 3.

As illustrated in FIG. 4b, the variable resistor 320 includes a plurality of resistors R1 to Rn connected to an input end in series, and a plurality of switching means SW11 to SW1n that are connected between the resistors R1 to Rn and an output end in parallel and separately operate according to the switch control value S8 that is provided from the logic controller 350.

Figure 4C:
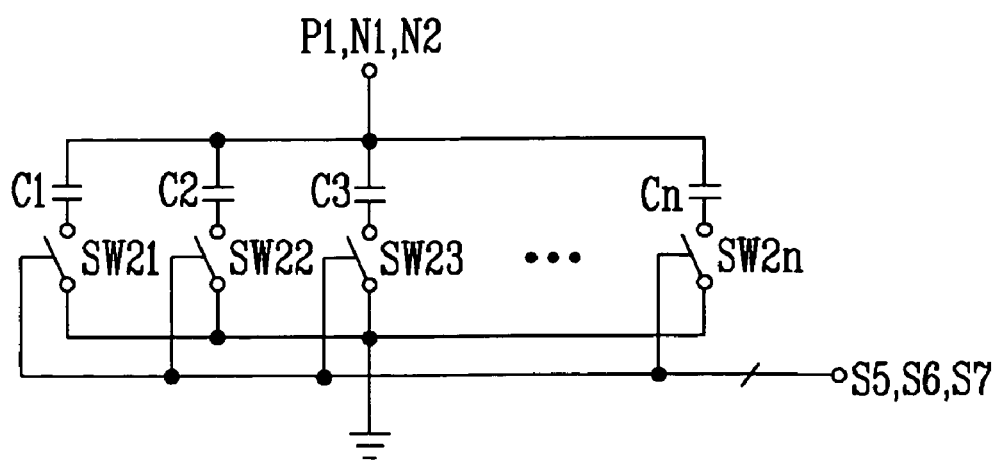
FIG. 4c is a circuit diagram illustrating a variable capacitor shown in FIG. 3.

As illustrated in FIG. 4c, the first to third variable capacitors 331 to 333 include a plurality of capacitors C1 to Cn connected to an input end in parallel, and a plurality of switching means SW21 to SW2n that are connected between the capacitors C1 to Cn and an ground terminal in series and separately operate according to the switch control values S5 to S7 that are provided from the logic controller 350.

When the circulator 300 is made up, the inductances of the inductors L1 to Ln of the first to fourth variable inductors 311 to 314, the resistances of the resistors R1 to Rn of the variable resistor 320, and the capacitances of the capacitors C1 to Cn of the first to third variable capacitors 331 to 333 can be determined as follows.

First, a Wilkinson power splitter is designed, and the λ/4 transmission line of the power splitter is substituted by an equivalent circuit that includes an inductor, a resistor and a capacitor at a specific frequency band. In the Wilkinson coupler structure in which power is equally distributed from the first terminal P1 to the second and third terminals P2 and P3, the values of parallel capacitors and series inductors of a pi equivalent circuit in a transmission line having an operating frequency of $f_0$ and a characteristic impedance of $z_0$ are given as the following Formulas 1 and 2.

$$C_{p2} = C_{p3} = \frac{1}{2\pi f_0 z_0} \qquad \text{Formula 1}$$

where, $C_{p2}$ is capacitance of the second variable capacitor 332, and $C_{p3}$ is capacitance of the third variable capacitor 333.

$$L_{s1} = L_{s3} = \frac{z_0}{2\pi f_0} \qquad \text{Formula 2}$$

where, $L_{s1}$ is inductance of the first variable inductor 311, and $L_{s3}$ is inductance of the third variable inductor 313.

Around the above capacitance and inductance, the capacitances of the parallel capacitors and the inductances of the series inductors are controlled so that the second terminal P2 and the third terminal P3 have unequal power split characteristics. A power split ratio K between the second terminal P2 and the third terminal P3 is defined as formula 3 given below.
Formula 3

$$k(dB) = S_{31} - S_{21}$$

where, $S_{31}$ and $S_{21}$ respectively denote a transmission coefficient from the first terminal P1 to the third terminal P3 and a transmission coefficient from the first terminal P1 to the second terminal P2 among S-parameters between the first to third terminals P1 to P3. In order to convert the unequal power splitter to an equivalent circuit of lumped elements (inductor L, resistor R, and capacitor C), the inductances $L_{s2}$ and $L_{s4}$ of the second and fourth variable inductors 312 and 314 are needed, in addition to the inductances $L_{s1}$ and $L_{s3}$ of the first and third variable inductors 311 and 313. When the power split ratio K is greater than 0, a transmission coefficient between the receiver connected to the third inductor P3 and the antenna increases, so that the insertion loss and noise figure (NF) of the circulator 300 on a reception path can be reduced. In this case, however, the loss on a transmission path increases. Therefore, the inductances of the first to fourth variable inductors 311 to 314 and the capacitances of the first to third variable capacitors 331 to 333 should be determined so that the power split ratio K becomes more than 0 during only a time section in which a signal is received. On the contrary, while a signal is not received, the power split ratio K should be kept less than 0 to further reduce the loss of the transmitter.

The values of the first to fourth variable inductors 311 to 314 and the first to third variable capacitors 331 to 333 are determined by the arrangement states of the inductors L1 to Ln, the capacitors C1 to Cn, and the switches SW1 to SWn and SW21 to SW2n. For example, the unit capacitors C1 to Cn constituting the capacitor array are arranged so that the capacitors C2 to Cn have capacitance that is two powers of the capacitance of the first capacitor C1, (for example, 100 fF, 200 fF, 400 fF, 800 fF, 1.6 pF, . . . ) and combining the capacitances can provide a desired capacitance. In the same manner, combining the inductances of the inductors L1 to Ln constituting the inductors array can provide a desired inductance. In implementing the circulator as a monolithic microwave integrated circuit (MMIC) or a radio frequency integrated circuit (RFIC), the circulator can be composed of two transmission and reception inductors having a fixed inductance because the inductors have a much greater size than other devices.

When an on-chip circulator is formed in MMIC form according to the present invention, it is very important to secure the performance of the switch arrangements SW1 to SWn, SW11 to SW1n, and SW21 to SW2n. The switch arrangements SW1 to SWn, SW11 to SW1n, and SW21 to SW2n can be implemented using a metal oxide semiconductor field effect transistor (MOSFET) or diode, or a micro electro-mechanical system (MEMS) device, which can increase integration. The use of a transistor is advantageous to integration into system-on-chip (SoC) but may degrade radio frequency (RF) characteristics such as NF, insertion loss, and linearity in an ultra high frequency (UHF) band.

For example, implementing the switch arrangements SW1 to SWn, SW11 to SW1n, and SW21 to SW2n using an MEMS device provides excellent performance but increases the size of the circulator. Thus, it is preferable to reduce the number of switches. Therefore, a capacitor arrangement C1 to Cn is preferably composed of between four to six capacitors including a few capacitors for compensating for process variables based on the capacitance Cpt at a transmission state and the capacitance Cpr at a reception state.

Alternatively, the switch arrangements SW1 to SWn, SW11 to SW1n, and SW21 to SW2n can be made up using a positive-intrinsic-negative (PIN) diode. For a number of switches, the RF characteristics may deteriorate due to the increase of the parasitic capacitance of the switches. Therefore, as described above, it is preferable to include two or three compensation capacitors based on the capacitance Cpt at the transmission state and the capacitance Cpr at the reception state, so that the number of the switches is minimized, the compensation capacitors being capable of compensating characteristic change resulting from the fabrication process variations and temperature.

In an ideal circulator, a signal is transmitted from the second terminal P2 to the first terminal P1 and from the first terminal P1 to the third terminal P3, but is not transmitted in a reverse direction. However, when the circulator according to the present invention is designed to minimize loss occurring in the process of signal transmission, a signal can be transmitted in the reverse direction.

Figure 5A:
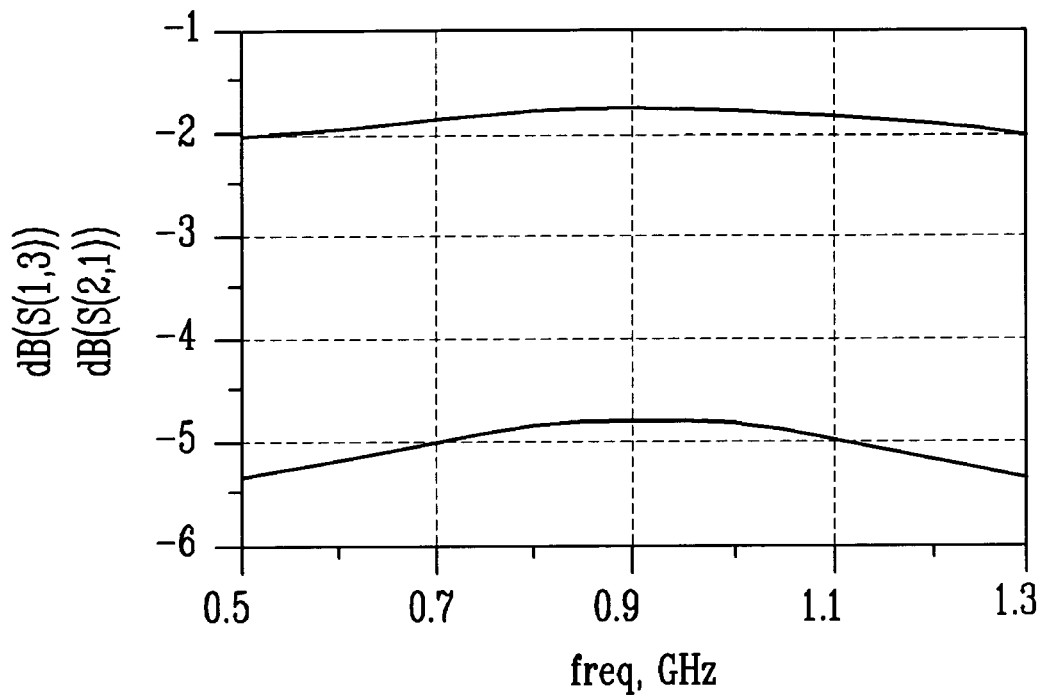
FIGS. 5a and 5b are graphs showing the result of S-parameter simulation of the circulator according to the present invention.
Figure 5B:
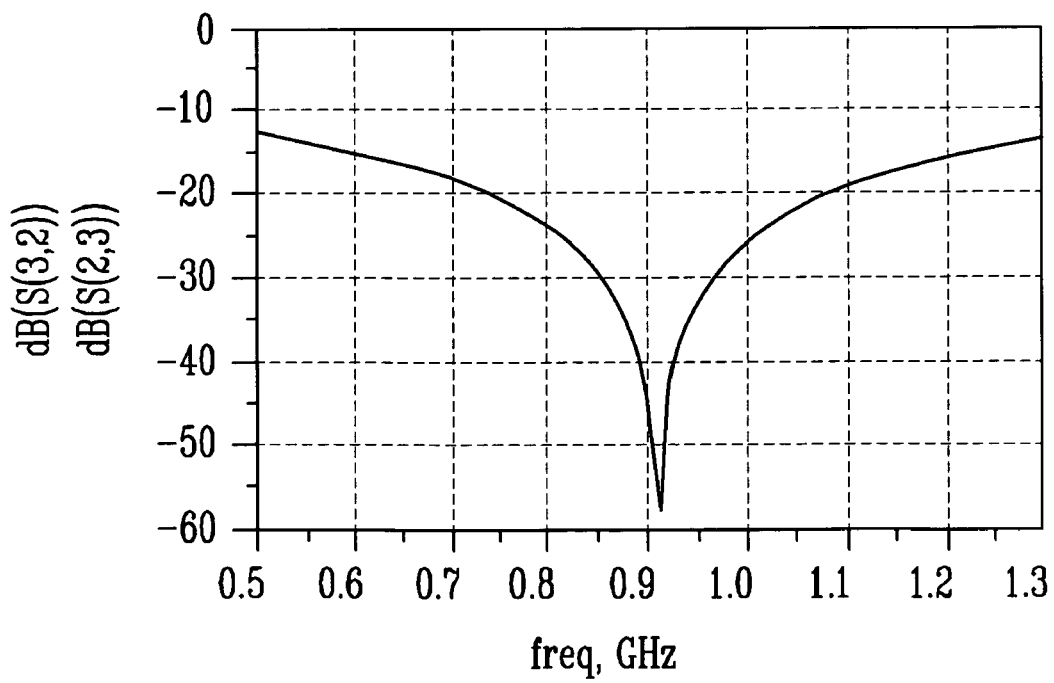

FIGS. 5a and 5b are graphs showing the result of the S-parameter simulation of the circulator according to the present invention when the power split ratio K is −3 dB, that is, when the output power at the second terminal P2 was designed to be two times the output power at the third terminal P3.

The loss of a signal that is output from the transmitter connected with the second terminal P2 to the antenna was about 1.8 dB at 900 MHz, and the loss of a signal that is input from the antenna to the receiver connected with the third terminal P3 was about 4.8 dB. Thus, it can be seen that there is a difference of about 3 dB between the transmission path and the reception path. In the case where the circulator of the present invention is applied to a reader of an RFID system, this corresponds to a time section in which a continuous wave (CW) signal is transmitted when the reader is in the transmission state, that is, before and after the reader sends a command to a tag or the tag sends information to the reader. In a passive RFID system, a reader should supply enough power to drive a tag, and the loss of a transmission path should be reduced because a communication distance is determined from a distance that the tag can be supplied with power from the reader rather than the receive sensitivity of the reader.

The point of time when the switch arrangements SW1 to SWn, SW11 to SW1n, and SW21 to SW2n are controlled to change the power split ratio K in the circulator according to the present invention may be determined based on a timing diagram defined in RFID system standardization documents. One example of the timing diagram will be now described.

Figure 6:
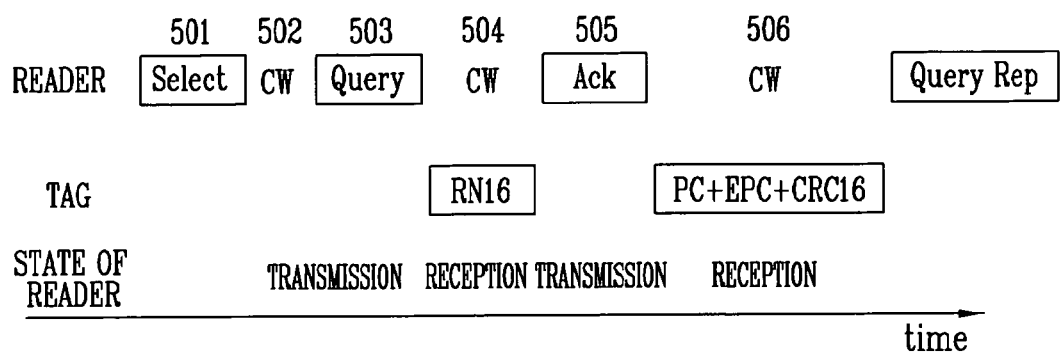
FIG. 6 shows state variation while a link is formed and data is then transceived between a reader and a tag in an RFID system.

FIG. 6 shows state variation while a link is formed and data is then transceived between a reader and a tag in an RFID system, showing operating states in a link mode of the reader by referring to the Generation-2 specification of electronic product code (EPC) Global that defines the RFID standards of a UHF band (See a specification for RFID Air Interface, EPC Radio-Frequency Identity Protocols Class-1 Generation-2 UHF RFID Protocols for Communications at 860 MHz-960 MHz).

While the reader receives a signal from the tag, it should continuously emit a CW signal to supply energy to the tag. During this period, the logic controller 350 of the circulator digitally controls the switches SW1 to SWn, SW11 to SW1n, and SW21 to SW2n based on switch control values stored in the memory 360 so that the power split ratio K becomes about 3 dB.

An exemplary embodiment of the present invention in which the circulator 300 is applied to the reader of an RFID system will be described with reference to FIG. 7.

Figure 7:
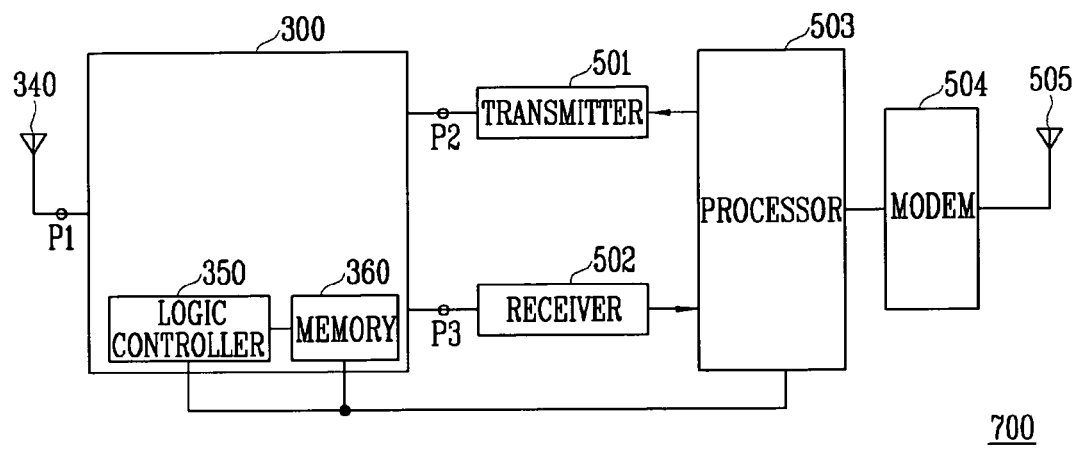
FIG. 7 is a block diagram illustrating an RFID reader having the circulator according to an exemplary embodiment of the present invention.

FIG. 7 is a block diagram illustrating an RFID reader 700 having the circulator 300 according to the present invention.

An antenna 340 is connected to the first terminal P1 of the circulator 300, a transmitter 501 is connected to the second terminal P2, and a receiver 502 is connected to the third terminal P3. The transmitter 501 modulates and amplifies a signal carrying tag information according to a certain standard, and sends the signal to a tag. The receiver 502 amplifies and filters tag information, which is reflected from the tag and then received through the antenna 340. A processor 503 controls the entire operation of the reader 700, generates the signal carrying tag information, and processes the received tag information. In addition, the processor 503 sends the received tag information to a modem 504 mounted in a mobile terminal such as a cellular phone so that the tag information is sent to an external information processing device (not shown).

The circulator 300 sends the output signal from the transmitter 501 to the antenna 340, and sends the signal received through the antenna 340 to the receiver 502. In sending the signal in such directions, the circulator 300 amplifies or attenuates the size of the signal by a transmission coefficient S21. Transmission coefficients between the terminals P1, P2 and P3 of the circulator 300 are determined by the values of capacitor arrangement and inductor arrangement. For example, while the tag is backscattering data to the reader 700, the receive sensitivity can be temporarily increased by increasing the transmission coefficient between the antenna 340 and the receiver 502.

The logic controller 350 controls switch arrangements SW1 to SWn, SW11 to SW1n, and SW21 to SW2n using proper switch control values among switch control values stored in the memory 360 according to the operating states of the reader 700 at the corresponding frequency band, so that the first to fourth variable inductors 311 to 314, the variable resistor 320, and the first to third variable capacitors 331 to 333 are set to have optimized values.

For example, referring to FIG. 4a, the first to fourth variable inductors 311 to 314 allow each switching means SW1 to SWn to be selectively turned on according to the switch control values S1 to S4 provided from the logic controller 350, so that inductances are set by the inductors L1 to Ln connected in series.

Referring to FIG. 4b, the variable resistor 320 allows each switching means SW11 to SW1n to be selectively turned on according to the switch control value S8 provided from the logic controller 350, so that a resistance is set by the resistors R1 to Rn that are connected in series.

Referring to FIG. 4c, the first to third variable capacitors 331 to 333 allow each switching means SW21 to SW2n to be selectively turned on according to the switch control values S5 to S7 provided from the logic controller 350, so that capacitances are set by the capacitors C1 to Cn that are connected in parallel.

When the reader 700 is configured as described above according to the present invention, the performance of the circulator 300 is measured in an initialization state, and switch control values for switch arrangements that are suitable for several operating states are calculated and stored in the memory 360. Here, each of the switch control values S1 to S8 has a number of bits corresponding to the switch arrangements SW1 to SWn, SW11 to SW1n, and SW21 to SW2n, each of the bits having a value of 0 or 1, or a value at a low level or a high level for digital control.

During most of the operation time of the reader 700, switch control values that allow loss between the transmitter 501 and the antenna 340 to be minimized are read from the memory 360, and the circulator 300 is set according to the switch control values. While information is sent from the tag to the reader 700, switch control values that can increase a transmission coefficient between the antenna 340 and the receiver 502 are read from the memory 360 to improve receive sensitivity, and the circulator 300 is set according to the switch control values.

Operation of the RFID reader 700 having the circulator 300 according to the present invention and being made up as described above is now described with reference to FIG. 8.

When the reader 700 is powered to operate (S101), the processor 503 performs a tuning process for setting the circulator 300 into an optimized condition (S102 to S104).

The tuning process is for compensating the characteristic variation of the circulator 300. The tuning process includes: measuring the leakage power of a signal transmitted from the transmitter 501 to the receiver 502 to calculate an isolation between the second terminal P2 and the third terminal P3 (S102); comparing the isolation with a standard value I_th (S103); and, when the isolation is less than the standard value I_th, setting the values of the first to fourth variable inductors 311 to 314, the variable resistor 320, and the first to third variable capacitors 331 to 333 by controlling the switch arrangements SW1 to SWn, SW11 to SW1n, and SW21 to SW2n, to minimize the leakage power, i.e., to maximize the isolation between the transmitter 501 and the receiver 502 (S104). In other words, the processor 503 repeatedly performs the steps S102 and S103, in which it generates a predetermined signal, sends the signal to the receiver 502 through the transmitter 501, and measures the isolation between the second terminal P2 and the third terminal P3, and allows the logic controller to read the stored switch control values from the memory 360 and to control the switch arrangements SW1 to SWn, SW11 to SW1n, and SW21 to SW2n, until the isolation becomes greater than the standard value I_th (S104).

When the values of the first to fourth variable inductors 311 to 314, the variable resistor 320, and the first to third variable capacitors 331 to 333 are set through the above-described process, the processor 503 detects or determines an operating mode and an operating state of the reader 700 (S105).

As illustrated in FIG. 6, when the reader 700 is in the transmission state that is a time section in which the reader 700 sends a "Select" command and a "Query" command to a tag and emits a CW, the logic controller 350 reads switch control values (Tx parameters) corresponding to the transmission state from the memory 360, and controls the switch arrangements SW1 to SWn, SW11 to SW1n, and SW21 to SW2n (S106). On the contrary, when the reader 700 is in the reception state that is a time section in which the reader 700 receives backscattered information from the tag, the logic controller 350 reads switch control values (Rx parameters) corresponding to the reception state from the memory 360, and controls the switch arrangements SW1 to SWn, SW11 to SW1n, and SW21 to SW2n (S108). Specifically, when the reader 700 is in the transmission state, the circulator 300 is set to make a signal transmission loss from the second terminal P2 to the first terminal P1 small and another signal transmission loss from the first terminal P1 to the third terminal P3 great. On the contrary, when the reader 700 is in the reception state, the circulator is set to make a signal transmission loss from the first terminal P1 to the third terminal P3 small and another signal transmission loss from the first terminal P1 to the second terminal P2 great.

It is determined whether or not transmitting/receiving commands and information between the reader 700 and the tag (S107 or S109) is completed (S110). When the information transmission or reception is completed, the reader 700 is kept in a standby state or stops operation to minimize power consumption (S111). On the other hand, when the information transmission or reception is not completed, the process proceeds to the step of detecting an operating mode and an operating state of the reader 700 (S105).

As described above, since the circulator of the present invention is made up of lumped elements such as an inductor, a resistor and a capacitor, it can be easily integrated as an MMIC or RFIC with a high density and requires a low manufacturing cost. In addition, the reader having the circulator can digitally and easily compensate for characteristic variations occurring during a manufacturing process or operation, so that the mass production cost of the module can be greatly reduced. Therefore, a SoC in which a digital circuit, a microprocessor and so forth are integrated is easily implemented through a conventional semiconductor process using the circulator of the present invention and the RFID reader having the circulator, so that the circulator and RFID reader are suitable for being mounted in a small mobile terminal such as a cellular phone and a personal digital assistant (PDA).

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A digitally controlled circulator comprising:
    first and second variable inductors connected between a first terminal and a second terminal in series;
    third and fourth variable inductors connected between the first terminal and a third terminal in series;
    a variable resistor connected between a first node and a second node, the first node being a junction of the first and second variable inductors and the second node being a junction of the third and fourth variable inductors;
    first, second, and third variable capacitors respectively connected between the first terminal and a ground terminal, between the first node and a ground terminal, and between the second node and a ground terminal; and
    a logic controller providing control values for changing each value of the first to fourth variable inductors, the variable resistor, and the first to third variable capacitors.

2. The digitally controlled circulator according to claim 1, further comprising a memory storing the control values.

3. A radio frequency identification (RFID) reader comprising:
    a circulator according to claim 1;
    an antenna connected to the first terminal of the circulator;
    a transmitter connected to the second terminal of the circulator and transmitting a signal carrying tag information through the antenna;
    a receiver connected to the third terminal of the circulator and receiving tag information through the antenna; and
    a processor connected to the logic controller of the circulator for generating the signal carrying tag information and processing the received tag information.

4. The RFID reader according to claim 3, wherein the first to fourth variable inductors, the variable resistor, and the first to third variable capacitors have values set so that a transmission loss from the second terminal to the first terminal is less than a transmission loss from the first terminal to the third terminal when the reader is in a transmission state, and a transmission loss from the first terminal to the third terminal is less than a transmission loss from the first terminal to the second terminal when the reader is in a reception state.

5. The digitally controlled circulator according to claim 1, wherein the first to fourth variable inductors include:

a plurality of inductors connected to an input end in series; and a plurality of switching means connected between the inductors and an output end in parallel and separately operating according to the control values provided from the logic controller.

6. The digitally controlled circulator according to claim 5, wherein the switching means includes a positive-intrinsic-negative (PIN) diode or a micro electro-mechanical system (MEMS) device.

7. The digitally controlled circulator according to claim 1, wherein the variable resistor includes:

a plurality of resistors connected between an input end and an output end in series; and a plurality of switching means connected between the resistors and the output end in parallel and separately operating according to the control values provided from the logic controller.

8. The digitally controlled circulator according to claim 7, wherein the switching means includes a positive-intrinsic-negative (PIN) diode or a micro electro-mechanical system (MEMS) device.

9. The digitally controlled circulator according to claim 1, wherein the first to third variable capacitors include:

a plurality of capacitors connected to an input end in parallel; and a plurality of switching means connected between the capacitors and a ground terminal in series and separately operating according to the control values provided from the logic controller.

10. The digitally controlled circulator according to claim 7, wherein the capacitors are arranged to have a capacitance that is two powers of the capacitance of the first capacitor.

11. The digitally controlled circulator according to claim 9, wherein the switching means includes a positive-intrinsic-negative (PIN) diode or a micro electro-mechanical system (MEMS) device.

* * * * *